(12) United States Patent
Durbeck et al.

(10) Patent No.: US 6,222,381 B1
(45) Date of Patent: Apr. 24, 2001

(54) SELF-CONFIGURABLE PARALLEL PROCESSING SYSTEM MADE FROM SELF-DUAL CODE/DATA PROCESSING CELLS UTILIZING A NON-SHIFTING MEMORY

(76) Inventors: Lisa J. K. Durbeck; Nicholas J. Macias, both of P.O. Box 510485, Salt Lake City, UT (US) 84151

( * ) Notice: Subject to any disclaimer, the term of this patent is extended or adjusted under 35 U.S.C. 154(b) by 0 days.

(21) Appl. No.: 09/476,645

(22) Filed: Dec. 31, 1999

(51) Int. Cl.[7] .................................. G06F 7/38
(52) U.S. Cl. ............................ 326/38; 326/38; 326/39; 326/40; 326/41
(58) Field of Search ............................... 326/37, 38, 39, 326/40, 41

(56) References Cited

U.S. PATENT DOCUMENTS

| | | | |
|---|---|---|---|
| 4,034,356 | * 7/1977 | Howley et al. | 340/173 R |
| 5,128,559 | 7/1992 | Steele . | |
| 5,394,031 | 2/1995 | Britton et al. . | |
| 5,450,557 | * 9/1995 | Kopp et al. | 395/375 |
| 5,742,180 | 4/1998 | DeHon et al. . | |
| 5,886,537 | 3/1999 | Macias et al. . | |
| 6,121,790 | * 9/2000 | Lee et al. | 326/39 |
| 6,124,731 | * 9/2000 | Young et al. | 326/41 |

* cited by examiner

Primary Examiner—Michael Tokar
Assistant Examiner—Vibol Tan

(57) ABSTRACT

A parallel processing system composed of a regular array of programmable logic devices, each of which can be configured to perform any logical mapping from inputs to outputs. The configuration of each device is specified by a small program memory contained inside each device. Any device's program memory can be read or written by any other device connected to it within the array. This facilitates the development of extremely parallel systems whose component devices can be modified in parallel. The resulting system is thus completely self-reconfigurable, avoiding the bottlenecks and critical failure points found in inherently externally-configured systems. This system's programmable devices utilize a non-shifting memory for storing their programs. This results in a significant reduction in the size and complexity of each programmable device as compared to a shift register-based design. Additionally, this leads to more predictable behavior as compared to a shift register-based design if only part of a cell's memory is read or written.

26 Claims, 14 Drawing Sheets

|  |  |  |  |  |  |  |  | 482↓ |  |  |  |
|---|---|---|---|---|---|---|---|---|---|---|---|
| 12 | 14 | 16 | 18 |  |  |  |  |  |  |  |  |

| D N | D S | D W | D E | C N | C S | C W | C E | D N | D S | D W | D E |
|---|---|---|---|---|---|---|---|---|---|---|---|
| 0 | 0 | 0 | 0 | 0 | 16 | 32 | 48 | 64 | 80 | 96 | 112 |
| 0 | 0 | 0 | 1 | 1 | 17 | . | . | . | . |  | 113 |
| 0 | 0 | 1 | 0 | 2 | 18 | . | . | . | . |  | 114 |
| 0 | 0 | 1 | 1 | 3 |  |  |  |  |  |  | 115 |
| 0 | 1 | 0 | 0 | 4 |  |  |  |  |  |  | 116 |
| 0 | 1 | 0 | 1 | 5 |  |  |  |  |  |  | 117 |
| 0 | 1 | 1 | 0 | 6 | . |  |  |  |  | . | 118 |
| 0 | 1 | 1 | 1 | 7 | . |  | . | . |  | . | 119 |
| 1 | 0 | 0 | 0 | 8 | . |  |  |  |  | . | 120 |
| 1 | 0 | 0 | 1 | 9 | 25 | 41 | 57 | 73 | 89 | 105 | 121 |
| 1 | 0 | 1 | 0 | 10 |  |  |  |  |  |  | 122 |
| 1 | 0 | 1 | 1 | 11 |  |  |  |  |  |  | 123 |
| 1 | 1 | 0 | 0 | 12 |  |  |  |  |  |  | 124 |
| 1 | 1 | 0 | 1 | 13 | 29 | . | . | . |  |  | 125 |
| 1 | 1 | 1 | 0 | 14 | 30 | . | . | . |  |  | 126 |
| 1 | 1 | 1 | 1 | 15 | 31 | 47 | 63 | 79 | 95 | 111 | 127 |

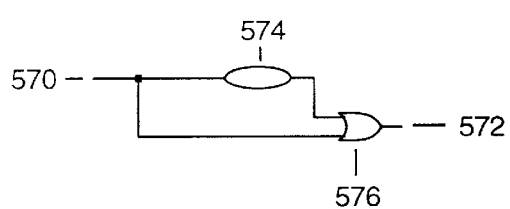
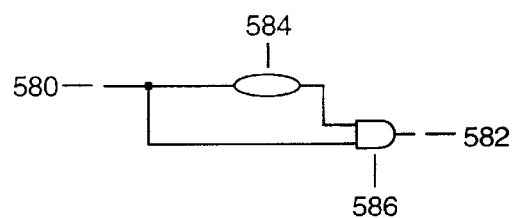
FIG. 12A    FIG. 12B
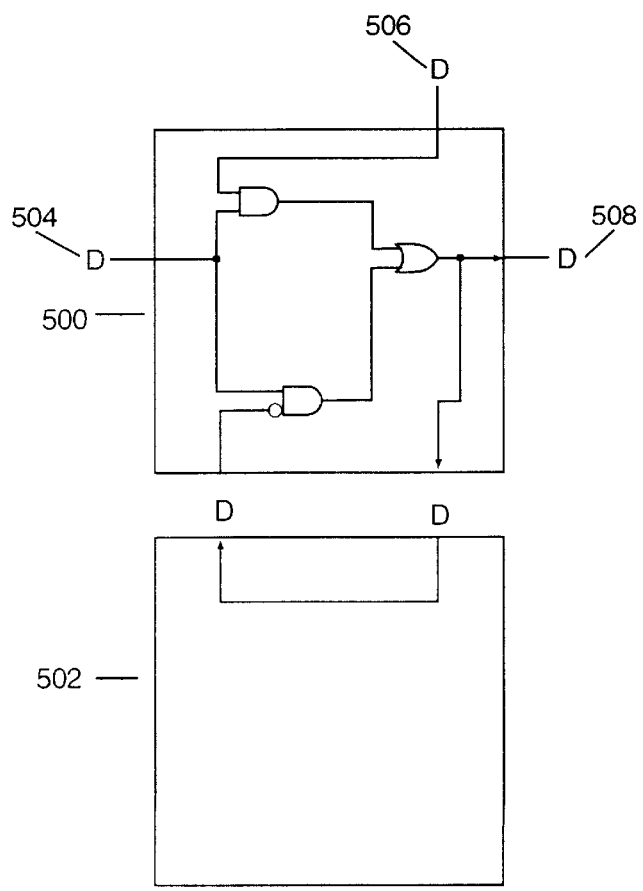
FIG. 13

SELF-CONFIGURABLE PARALLEL PROCESSING SYSTEM MADE FROM SELF-DUAL CODE/DATA PROCESSING CELLS UTILIZING A NON-SHIFTING MEMORY

BACKGROUND OF THE INVENTION

The present invention relates to the field of fine-grained self-configurable hardware. In particular, it relates to a self-configurable parallel processing system composed of a regular collection of cells whose specific behavior is controlled by software contained within each cell. More particularly, it relates to a self-configurable processing system where each cell's software is stored in a non-shifting memory contained within the cell.

Reconfigurable devices are hardware whose specific behavior can be specified via software contained within the device. Such devices have found numerous applications in a variety of areas. They are useful for rapid prototyping, for allowing minor changes to be made to circuitry in the field, or for reusing a small amount of hardware for different applications. More recently, reconfigurable devices have been used extensively in evolvable hardware research, where circuits are designed not by humans, but by machines, using a trial-and-error approach.

A common problem with reconfigurable devices is how to modify their configuration as quickly as possible. Early reconfigurable devices, such as U.S. Pat. No. 5,128,559 to Steele (1992), use RAM within the device to store configuration information. This RAM is controlled via an external processor, which sends configuration strings into the RAM, thereby determining the configuration of the device.

This approach has serious drawbacks, since as the device size increases, so does the size of the configuration string. U.S. Pat. No. 5,394,031 to Britton, et al. (1995) describes a reconfigurable device which is partially reconfigurable, meaning that if only one piece of the configuration is being changed, the entire configuration string need not be sent. Rather, a subset describing just the changed pieces can be sent to update the existing configuration. This allows minor modifications to a device's existing configuration, but does not improve the speed for reconfiguring large sections of the device.

U.S. Pat. No. 5,742,180 to DeHon, et al. (1998) describes a reconfigurable device supporting multiple contexts, so the configuration of circuits within the device can be changed rapidly via a relatively short context-switch command. However, this only allows rapid switching among pre-programmed contexts. Loading in a new configuration for the entire device is still extremely time-consuming, with configuration time generally increasing with device size.

All these devices suffer from a common problem, in that their reconfiguration is externally controlled, which fundamentally limits the configuration bandwidth. Since the configuration information is being supplied by an external controller, there is an inherent bottleneck in the transmission of configuration information.

U.S. Pat. No. 5,886,537 to Macias, et al. (1999) describes a self-configurable device which circumvents this fundamental limitation. This device consists of a large number of regularly-connected reconfigurable cells. These cells can process data as well as configuration information interchangeably, thus allowing the task of configuring the device to be distributed among the reconfigurable cells themselves. In this case, a device with more cells therefore automatically contains more configuration controllers as well. This allows configuration of multiple sections of the device to occur in parallel, offering tremendous speedup potential. This device also has other advantages, including a regular structure which has benefits both in terms of fault tolerance and ease of manufacturing.

However, the device described in U.S. Pat. No. 5,886,537 has disadvantages as well. Its biggest disadvantage is the complexity of the underlying cell structure. The largest part of each cell's circuit is the memory employed for storing the cell's configuration information. This memory is implemented as a shift register, since the basic configuration mechanism is to serially shift in a new configuration truth table, while serially shifting out the cells' old truth table.

One disadvantage of using a shift register is the size required to implement such a circuit. In the prototype cMOS implementation of the device, approximately 50% of each cell's 2500 transistors were used for implementing the shift register. Moreover, higher-dimensional versions of the basic cell require significantly more bits for their truth table. For example, whereas a 4-sided cell requires 128 bits of storage, a 6-sided cell requires 768 bits of storage for the truth table. In contrast, the other parts of the circuit grow linearly with the number of sides. So a 6-sided device might require 1900 transistors for miscellaneous logic vs. 7500 for the memory, meaning the memory alone accounts for 80% of the device's transistors. Therefore, it is advantageous to reduce the size and complexity of the truth table memory within the basic cell.

Additionally, in the system described by U.S. Pat. No. 5,886,537, since a cell's truth table is actually being shifted as the cell is programmed, the truth table stored within a cell during its programming is generally only correct after the cell is fully programmed. Even if only a few bits are being changed, the entire truth table is disturbed by the programming operation. If the cell were to momentarily or prematurely leave its configuration (C-) mode, the truth table (which the cell would immediately start executing) would be incorrect. Viewed another way, as a bit is shifted into a cell's truth table, there is no way to know the final position of that bit in the cell's truth table. The bit is shifted throughout the truth table, and its eventual position depends on when the cell exits C-mode.

This is a serious drawback for evolvable hardware work, where essentially random bit streams will be loaded into a cell's truth table. Without knowing the position each bit will occupy in the target cell's truth table, there is no way to prevent the programmed cell from entering an unrecoverable state. While such unrecoverable states do not physically damage the device, they do make individual cells unusable until the entire system is reset.

OBJECTS AND ADVANTAGES

Accordingly, several objects and advantages of the present invention are:

a) to provide a configurable data processing cell whose behavior can be specified via an internally stored truth table;

b) to provide a cell structure whereby each cell can process both data and configuration information from neighboring cells;

c) to provide a self-configurable system composed of a regular collection of such cells, thereby allowing distributed, internal configuration control;

d) to provide a cell structure which can utilize a truth table memory with fewer transistors than a shift register with the same storage capacity;

e) to provide a cell structure which can utilize a truth table memory which is higher density than a shift register with the same storage capacity;

f) to provide a cell programming paradigm where each bit loaded into a cell's truth table immediately occupies its correct intended location in the truth table;

g) to provide a cell programming paradigm which allows a truth table to be partially configured, with only the loaded bits being changed;

h) to provide a cell programming paradigm which allows a partial programming cycle to be followed by another programming cycle, such that the second cycle begins at the start of the truth table, even though the first cycle terminated prior to reaching the end of the truth table.

Further objects and advantages are to provide a cell structure in which certain subsystems of each cell's circuitry can be shared among multiple cells, thereby leading to smaller and simpler individual cells. Still further objects and advantages will become apparent from a consideration of the ensuing descriptions and drawings.

BRIEF DESCRIPTION OF THE DRAWINGS

FIG. 10 shows the correspondence between the 16×8 and the 128×1 views of a cell's memory.

FIGS. 12A and 12B show circuits for implementing delays based on the direction of an input transition.

FIG. 13 shows two cells configured to act as a D-flip flop.

SUMMARY

The present invention achieves a fundamental duality between data processing and code processing in a self-reconfigurable system, by building the system out of programmable processing elements which are themselves fundamentally self-dual. The result is a parallel processing system whose hardware can be configured in virtually any way desired, while maintaining the fundamental capability of any number of pieces of the system to independently read, modify and write the hardware configuration of any other pieces of the system. Unlike prior inventions, the present system achieves this without use of a shifting memory inside each cell. This leads to smaller, simpler cells, and a correspondingly higher-density system. Additionally, the present cell design allows large subsystems within each cell to be shared among multiple cells, thereby further reducing each cell's size and complexity. These enhancements also lead to more predictable behavior while a cell is being programmed, which is necessary for using these cells in systems where semi-random configurations can occur.

Description—First Embodiment

Figure 1:
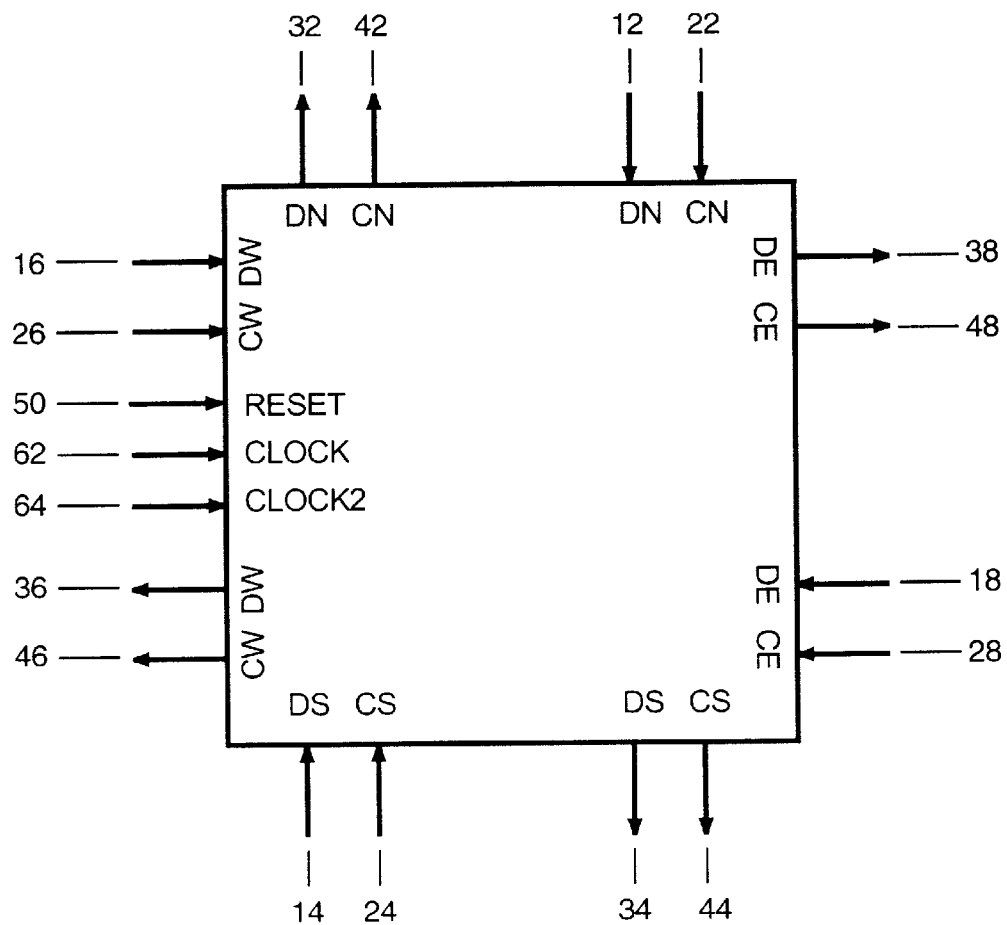
FIG. 1 shows the basic inputs and outputs to a single cell.

FIG. 1 shows one particular embodiment of the present invention as a four-sided cell. In this embodiment, the cell has four D inputs 12, 14, 16 and 18, and four C inputs 22, 24, 26 and 28. For convienence, all inputs and outputs are referenced using compass directions N, S, W and E. Additionally, the cell has four D outputs 32, 34, 36 and 38, and four C outputs 42, 44, 46 and 48. Finally, each cell has a reset input 50 and a pair of clock inputs 62 and 64. Although the design can be implemented using a single clock, this embodiment utilizes a two-phase clock for simplicity. This figure does not show any necessary power connections which might be needed by the underlying technology.

Figure 2:
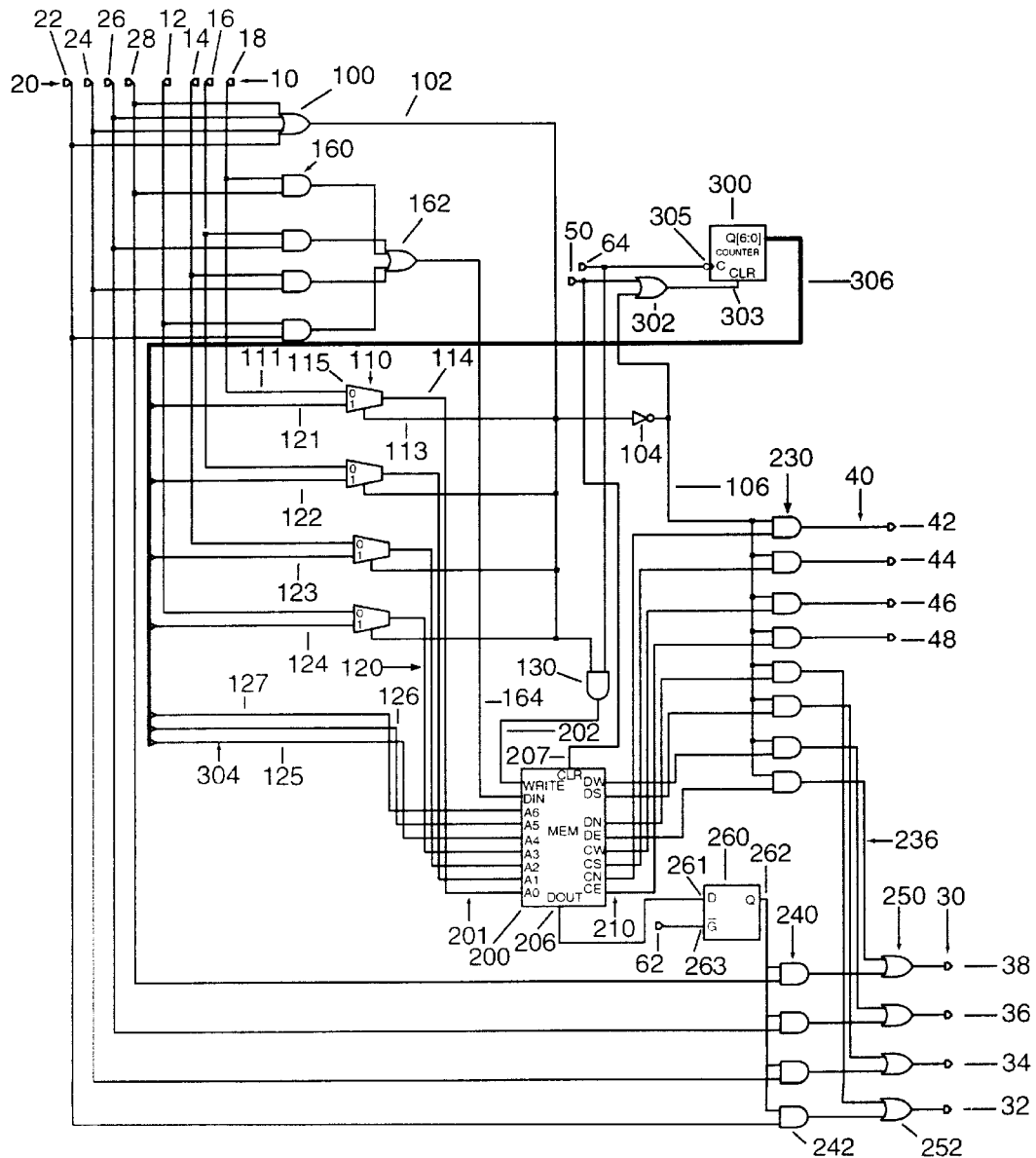
FIG. 2 illustrates gate-level details of the first preferred embodiment.

FIG. 2 shows gate-level details of this embodiment of a single cell. The cell has four data inputs 10, four control inputs 20, four data outputs 30, four control outputs 40, two clock inputs 62 and 64, and a reset input 50.

Seven-bit counter 300 produces consecutive output values which are sent along seven-bit bus 306. The counter increments each time clock input 305 drops form 1 to 0, unless clear input 303 is set to 1, in which case all outputs are 0. Clock input 305 is fed from clock input 64. The individual signals from bus 306 are tapped on lines 121 (least significant bit), 122, 123, 124, 125, 126 and 127 (most significant bit), in increasing order of significance.

The four multiplexers 110 each select one of their inputs based on a select line. For example, multiplexer 115 receives two input values, one from data input 111 and one from data input 121. It also receives a select value from select input 113. If select input 113=0, then data input 111 is passed to output 114. If select input 113=1, then data input 121 is passed to output 114.

Flip flop 260 is a simple data flip flop, which latches D input 261 when gate input 263 is 0. The latched value is presented on output 262. Gate input 263 is connected to clock input 62.

Memory 200 is a 16×8 memory. One of 16 memory locations is selected by the four least significant bits of address bus 201, which are supplied by bus 120. The selected 8 bits read from memory 200 are sent to outputs 210.

Memory 200 is also accessible as a 128×1 memory. In this case, one of 128 locations is s elected by using the full 7 bits of address bus 201. In this case, bus 120 specifies the four least significant bits of the 7-bit address, and bus 304 specifies the three most significant bits. The selected single bit is sent to output 206. Input line 164 supplies a single bit value to write into memory at the selected location. The value on input line 164 is written when write line 202 is set to 1. Reset line 50 is connected to reset input 207 on memory 200.

Figure 3:
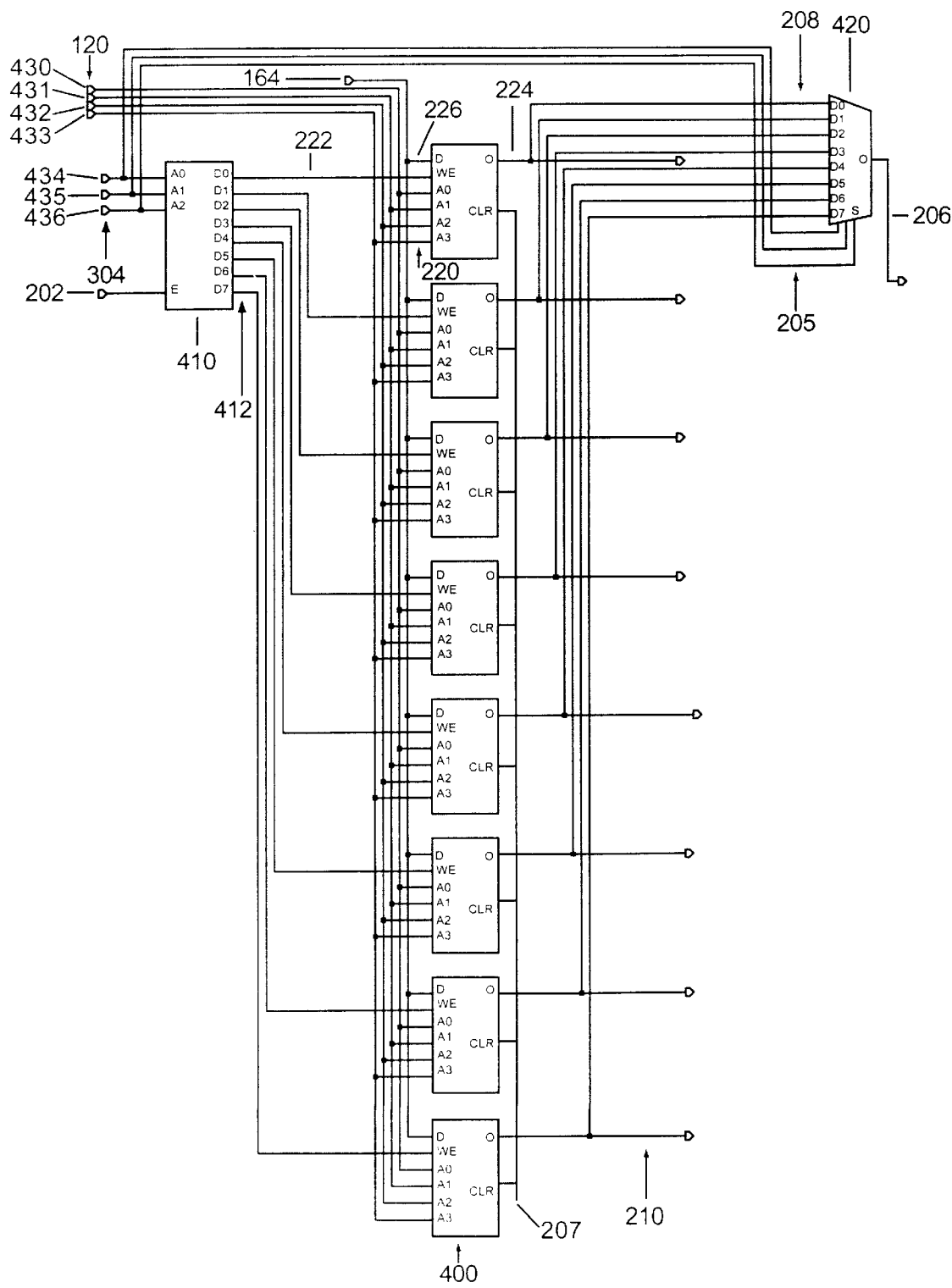
FIG. 3 shows gate-level details of the memory subsystem for this embodiment.

FIG. 3 shows the details of memory 200. Inputs 120 are sent to the four bit address input 220 on each of eight 16×1 memories 400. Data input 226 to each memory comes from input 164. Selector 410 passes input 202 to one of eight outputs 412, depending on 3-bit input value 304. Each output of 412 is sent to Write Enable input 222 of each memory 400. Each output bit 224 from each memory 400 appears on one of the output lines 210. Finally, these eight outputs are also sent to 8-1 selector 420, which picks one of its inputs 208 based on select inputs 205, and passes that selected input to output 206. Inputs 208 are fed from outputs 210, while select inputs 205 are fed from 3-bit input value 304. Reset line 207 initializes each 16×1 memory 400 to a pre-defined known state, such as all zeros. Viewed as a seven-bit address bus, input lines 430, 431, 432, 433, 434, 435 and 436 correspond to bits 0 (the least significant bit), 1, 2, 3, 4, 5, and 6 (the most significant bit), respectively. Note however that the particulars of this correspondence are mostly irrelevant, as long as they are known and are consistent from cell to cell.

Figure 4:
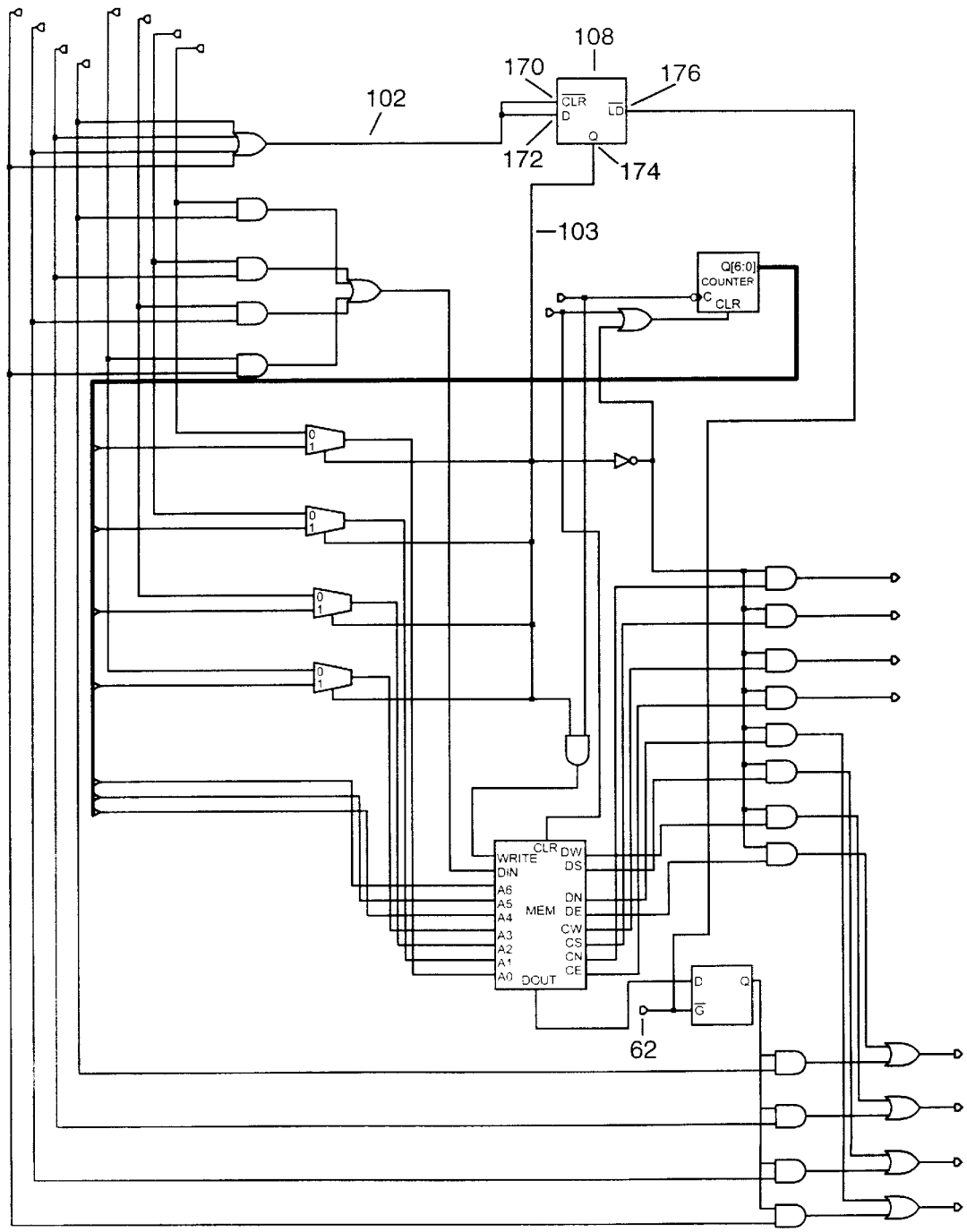
FIG. 4 shows an optional enhancement to the circuit of FIG. 2 which synchronizes mode changes with the incoming clocks.

FIG. 4 shows an optional modification to the logic of FIG. 2, by adding flip flop 108 between line 102 and line 103. Line 102 feeds CLEARBAR input 170 of flip flop 108 as well as D input 172 of flip flop 108. Clock input 62 feeds LOADBAR input 176 of flip flop 108, and flip flop 108's output 174 is sent to line 103. This optional enhancement synchronizes changes in the cell's configuration mode with changes in the incoming clock lines 62 and 64.

Figure 5:
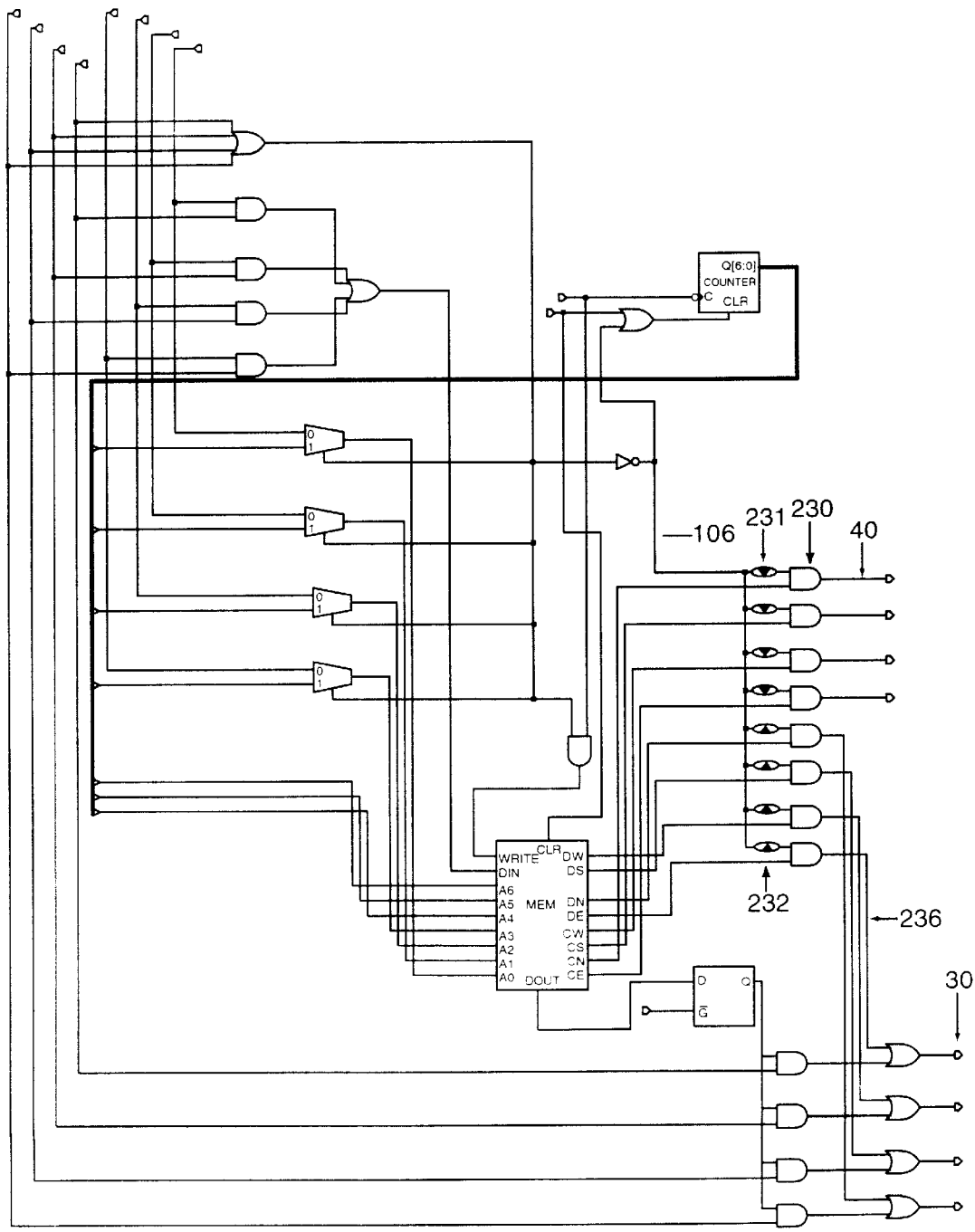
FIG. 5 shows another enhancement to the circuit of FIG. 2 which delays certain output changes.

FIG. 5 shows another optional modification, where delay circuits 231 and 232 have been added to mode line 106 where it feeds the input of gates 230. Delay circuits 231 and 232 behave differently depending on whether their input is changing from 0 to 1 of from 1 to 0. FIG. 12 illustrates a pair of sample circuits for implementing such delays.

Figure 6:
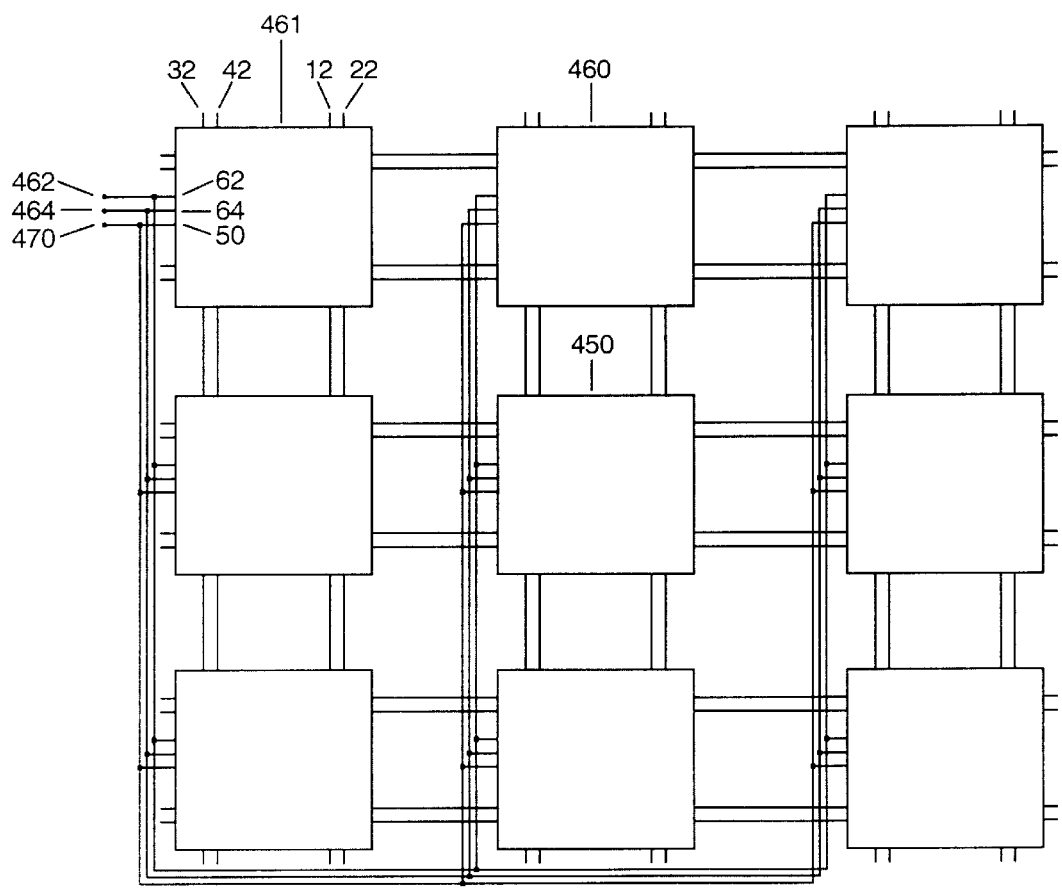
FIG. 6 shows a collection of cells configured to operate as a 3×3 grid.

FIG. 6 shows a collection of four-sided cells hooked together to form a small 3×3 grid. Cell 450 is an interior cell, and as such all of its inputs are connected to neighboring cells' outputs. Likewise, 450's outputs are connected to neighboring cells' inputs. For example, cell 450's D Output 32 to the North is connected to cell 460's D Input 14 from the South.

Additionally, clock inputs 462 and 464 are connected to clock inputs 62 and 64 of each cell, respectively. Finally, reset line 470 is connected to reset input 50 of each cell.

Operation—First Embodiment

Figure 7:
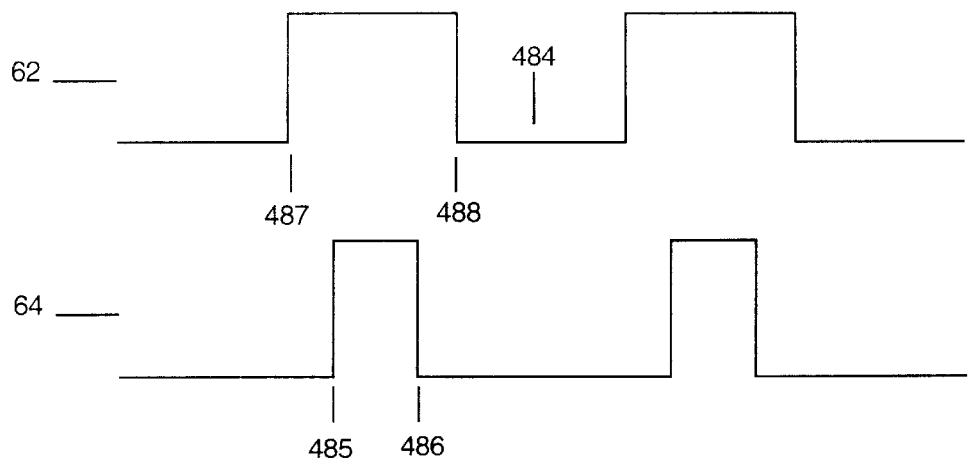
FIG. 7 shows timing diagrams for the clock inputs to a cell.

While a useful system consists of numerous individual cells connected, for example, as in FIG. 6, the behavior of the system can be understood by analyzing the behavior of a single cell, such as the one shown in FIG. 2. System operation begins by applying clock signals to clock inputs 62 and 64. For this embodiment, a two-phase clock is used, as shown in FIG. 7. This clocking should be applied throughout all operations of the system.

Reset line 50 in FIG. 2 is asserted to initialize the system. This line should remain asserted throughout at least one complete clock cycle before returning to 0. For normal operation of the system, reset line 50 should remain at 0.

Reset line 50 drives reset input 207 of memory 200, which sets the contents of the memory to a known state, such as all zeros. If all memory locations have been reset to 0, then all cell outputs will be 0, a suitable initial state. However, other initial configurations are anticipated. Reset line 50 also causes OR gate 302 to send a 1 to CLEAR input 303 of counter 300, setting its outputs to 0 as well.

The basic behavior of a cell depends on which of two modes the cell is currently operating in. These modes are called C-mode and D-mode. C inputs 10 determine the current mode of the cell. If all C inputs 10 are 0, OR gate 100 outputs a 0 on line 102, and the cell is said to be in D-mode. If any C inputs are 1, then OR gate 100 outputs a 1, and the cell is said to be in C-mode. Line 102 may be considered the C-mode line.

When a cell is in D-mode, it is basically a simple combinatorial device, whose input-to-output mapping is specified by the contents of its memory 200. Thus, in D-mode, a cell may be considered to be executing the program stored inside memory 200. When a cell is in C-mode, memory 200 is read and written one bit at a time, in synchronization with clock inputs 62 and 64. Thus in C-mode, a cell's memory (program) can be examined and modified.

D-mode operation proceeds as follows. The 0 value on line 102 causes multiplexers 110 to select their 0 inputs, which come from D inputs 10. The four outputs 120 from the multiplexers are sent to the lower four address bits of memory 200. Additionally, AND gate 130 outputs a 0, since one of its inputs comes from line 102 which is 0. Hence WRITE input 202 to the memory is 0, and the memory's contents remain unchanged.

Memory 200 is organized as a 16×8 memory. The four address bits from outputs 120 select a single 8-bit output row from the memory. These 8 output bits are sent to the memory's output lines 210. Inverter 104 toggles 102 and thus outputs a 1 on 106. This causes the memory's outputs 210 to be ANDed with 1s by gates 230. Hence C outputs 40 come from four of the output bits from memory 200, and lines 236 come from the other four outputs bits from memory 200. Line 106 is also passed by OR gate 302 and causes a 1 on the CLEAR input of counter 300, which thus retains its value of 0. As long as a cell remains in D-mode, counter 200 remains in a cleared state, i.e., all its outputs 306 remain 0. Clock inputs 62 and 64 are effectively ignored in this mode.

Additionally, since all four C inputs 20 are 0, AND gates 240 each output 0 regardless of output 262 from flip flop 260, so OR gates 250 simply pass the remaining four memory outputs from lines 236 to D outputs 30.

Figure 8A:
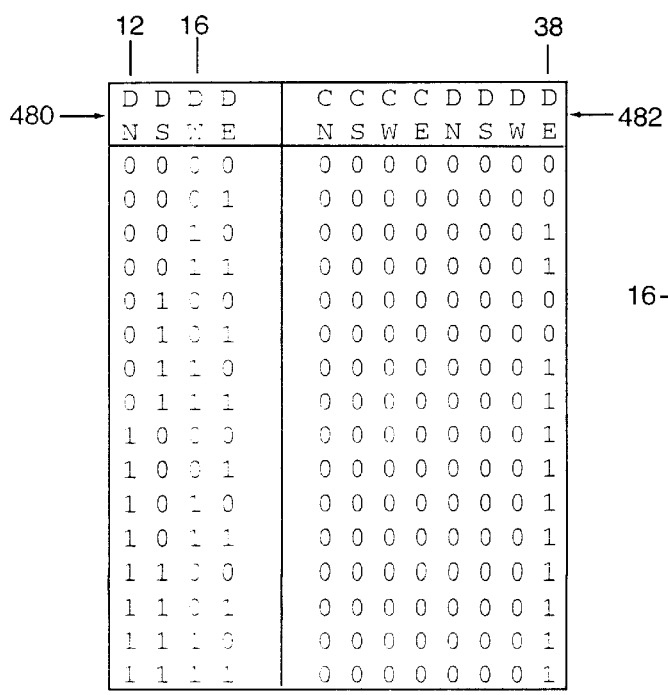
FIGS. 8A and 8B show a sample configuration of a single cell.
Figure 8B:
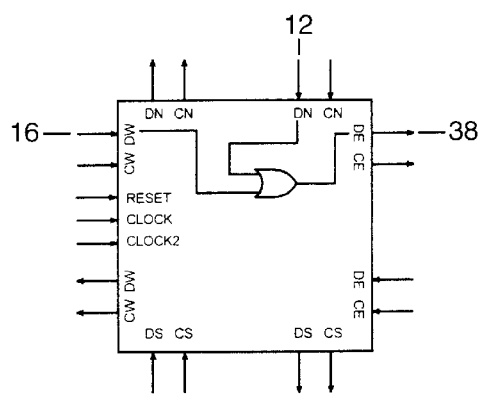

Thus, when all C inputs 20 are 0, the cell's D inputs 10 are used to select a single row from the cell's 16×8 memory, and the 8 selected bits are sent to the cell's C outputs 40 and D outputs 30. In this mode, memory 200 is effectively a read only memory, and may be viewed as containing a truth table for the cell. FIG. 8A shows a sample memory configuration which implements a two-input OR gate in a D-mode cell. Columns 480 correspond to the values of the cell's D inputs, and columns 482 show the corresponding C and D output values. FIG. 8B shows the equivalent logic diagram for a cell with the given memory configuration operating in D-mode. The cell accepts two inputs 16 and 12, ORs them, and sends the result to output 38. All other outputs are 0.

C-mode occurs when C inputs 20 are 1. In this case, line 102 is also 1, so line 106 is a 0, and AND gates 230 all output 0, thus all C outputs 40 are 0. Lines 236 will also be all 0. Since line 106 and reset line 50 are both 0, so is the output of gate 302, and thus CLEAR input 303 of counter 300 is de-asserted. Counter 300 thus counts up one bit each time clock input 64 drops from 1 to 0. Note that 300 can be any 7-bit counter, or, more generally, any circuit which produces a repeating pattern of 128 distinct 7-bit numbers. For example, this can be implemented via a Linear Feedback Shift Register. Also, the outputs need not be synchronous, that it to say, there may be a brief period of instability in outputs 306 following the falling transition of clock input 64.

In C-mode, a cell's memory contents is available for reading from outside the cell. The 1 value on line 102 causes mutiplexers 110 to select their 1 inputs, which come from the lower 4 bits of counter 300. Thus lines 120 reflect these four counter bits, which are sent to the lower address bits of memory 200. Additionally, the 3 most significant bits on lines 304 from counter 300 are sent to the upper address bits of memory 200. Thus all seven output bits from counter 300 are sent to the address inputs of memory 200. Though memory 200 is organized as a 16×8 memory, it can also be viewed as a 128×1 memory, where seven address bits are used to select a single bit within the memory. The single selected bit is presented on output 206. This output is fed to the input of flip flop 260, where it is latched when flip flop 260's gate input 263 is 0. This gate input is supplied by clock line 62, thus flip flop 260 latches memory output 206 whenever clock input 62 is 0.

Flip flop 260's output 262 is conditionally passed by gates 240, which AND output 262 with the four C inputs 20. If, for example, C input 22 is 1, then AND gate 242 will pass output 262 to the input of OR gate 252. Since the other input to OR gate 252 is 0 (all gates 230 are outputting 0). OR gate 252 simply passes output 262 to data output 32. The effect is that on any side where the C input is 1, the corresponding D output presents the value from output 262, which is a latched copy of memory 200's output.

This is therefore the mechanism used to read the content's of a cell's memory. The cell is placed in C-mode by asserting one or more C inputs, and the contents of the memory are read serially on the corresponding side's D output. Counter 300 specifies the memory address being read, and on each downward transition of clock input 64, the counter is incremented and the next memory location is selected.

In C-mode, a cell's memory contents can also be written from outside the cell. Each D input 20 is ANDed by gates 160 with a corresponding C input 10. The result of all four ANDs is ORed by gate 162, the result appearing on line 164. The effect here is to select D inputs from each side where a C input is 1, and to OR those selected D inputs. The final value on line 164 is sent to the data input port of memory 200. This value is written into the memory location selected by address lines 201 whenever line 202 is 1. Line 202 is generated by gate 130 which ANDs line 102 (which is 1 in C-mode) and clock input 64. Thus, whenever clock input 64 is 1, the computed input value on line 164 is written into the memory location specified by counter 300.

This is the mechanism used to write a cell's memory. The cell is placed in C-mode by asserting one or more C inputs, and data is applied to the corresponding side's D input. Each time clock input 64 is set to 1, the supplied D input value is written into memory at the location specified by counter 300.

FIG. 7 shows timing diagrams for these behaviors of a C-mode cell. The complete clock cycle begins with both clock input 62 and clock input 64 set to 0. If the cell has just entered C-mode, counter 300 will be clear, and its outputs 306 will all be 0. Counter 300 specifies an address to memory 200, and the bit stored at that address appears on output 206. Flip flop 260 passes that value to its output 240. Thus the cell's D outputs 30 (on sides where the corresponding C input is 1) show the bit value stored at the addressed memory location. The cell's C outputs remain at 0 throughout C-mode operation.

At point 487, clock input 62 is raised to 1, and output 206 of memory 200 is latched by flip flop 260. Thus D outputs 30 of the cell are effectively latched.

At point 485, clock input 64 is raised. This asserts write input 202 of memory 200, and the computed input value 162 is written into the memory location specified by counter 300. Note that while this may change the value stored in memory, and thus the memory's outputs, flip flop 260 has latched the previous output value, and thus the cell's D outputs remain unchanged.

At point 486, clock input 64 is dropped to 0. This de-asserts write input 202 of memory 200, while simultaneously incrementing counter 300. Thus a new location in memory 200 is selected, and the bit value stored at this new address is sent to output 206 (though the cell's outputs still remain unchanged).

Finally, at point 488, clock input 62 is dropped to 0, which causes flip flop 260 to pass memory 200's output value to its output 240, and thus to the cell's D outputs. During the period 484 these new output values are passed to neighboring cells' inputs, which themselves may change their output values accordingly.

Summarizing, in C-mode, counter 300 selects consecutive memory locations in memory 200, and the stored value is sent to D outputs on each side where the corresponding C input is 1. When clock input 62 is raised, these outputs are latched. When clock input 64 is raised, a computed incoming bit value is written into the selected memory location. When clock input 64 drops, counter 200 increments, and when clock input 62 drops, the data stored at the new address is used to set the cell's D outputs accordingly.

Figure 9:
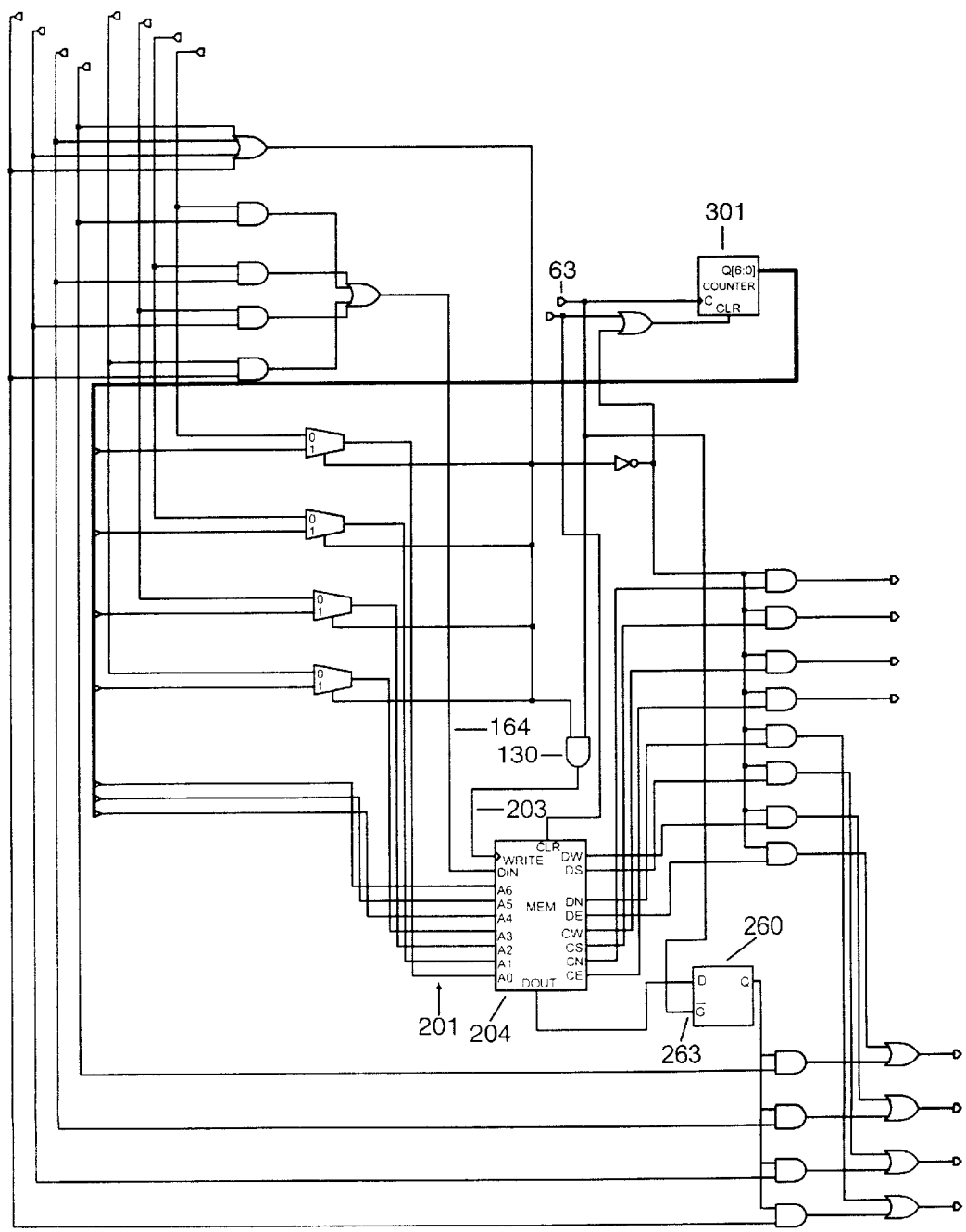
FIG. 9 shows a variation of the circuit of FIG. 2 which uses a single-phase clock.

Note that there are many possible variations on implementing this sequence of events. FIG. 9 shows a circuit almost identical to FIG. 2, except that it utilizes a single clock 63. In this implementation, counter 301 is positive-edge triggered. Memory 204's write line 203 is also positive edge triggered. A single clock 63 is supplied to counter 301's clock input, and to flip flop 260's gate input 263. This same clock feeds the input of AND gate 130, whose output is sent to write line 203. The circuits should be wired so that, on the rising edge of clock 63, the following events occur, in the given order (assuming the cell is in C-mode):

1. Flip flop 260 latches its input
2. Memory 204 writes the value from data input line 164 to the memory location specified by address lines 201
3. Counter 301 increments its value, which changes the value on address lines 201

Such ordering is easily established by adding delay gates or extra capacitance within the circuit.

FIG. 3 shows the details of memory 200, which is accessible as both a 16×8 and a 128×1 memory. As a 16×8 memory, a four bit address is sent in on address lines 120. This address selects one bit from each of the eight 16×1 memories 400. The output bit from each of these eight memories is sent to each of eight outputs 210. In this context, the memory is read-only.

As a 128×1 memory, a single bit can be read and written. To read a bit, a four bit address is sent in on lines 120, and one bit is selected from each memory, as above. However, three more address bits are specified on lines 304. These three bits feed select input 205 of selector 420, which picks one of the eight memory outputs 210, and passes it to memory output 206. Thus a seven-bit address selects a single bit from the eight-bit output of the memories 400.

To write a bit, write line 202 is asserted. This causes selector 410 to output a 1 on one of eight lines 412, depending on the value of address lines 304. The single line of 412 with a 1 on it will cause exactly one of the memories 400 to receive a 1 on its write enable line. Data input 164 is sent to the data input line of each memory 400, and is thus written into the selected memory. Thus a seven-bit address bus selects a single bit location in one of the memories 400 to store the incoming data bit from line 164.

FIG. 10 shows the correspondence between the 16×8 and 128×1 arrangements of memory 200. As a 16×8 memory, one row is selected based on inputs 12, 14, 16, and 18, and eight outputs appear in output columns 482. For example, as a 16×8 memory, if the four-bit input value is 1001 (binary), then the output values 491 are selected. These values correspond to memory locations 9, 23, 41, 57, 73, 89, 105 and 121 inside the full 128-bit memory. As a 128×1 memory, a single bit is selected, based on the seven-bit address value. For example, if the seven-bit address has a value of 115 (decimal), then bit 490 (which is memory location 115) is selected for reading or writing.

The present invention clearly differs from U.S. Pat. No. 5,886,537 in its implementation. While U.S. Pat. No. 5,886, 537 clearly specifies a shift register in its claims, the present invention utilizes only a non-shifting memory. Moreover, there are functional differences between the present invention and the prior art. One difference is that, for the present invention, a bit which is loaded into a C-mode cell immediately occupies its final location in that cell's truth table, whereas in the prior art each bit is shifted closer and closer to its final destination on each clock cycle, only arriving at that location 128 cycles after the cell entered C-mode. Hence, the prior art suffers from being unable prematurely stop a programming cycle without leaving the entire truth table disturbed. Furthermore, in the present invention, if a cell is returned to D-mode after fewer than 128 clock cycles, the programming sequence is in some sense reset. The cell can re-enter C-mode at any time, and incoming bits will again immediately occupy their correct future position in the cell's truth table. In the prior art, upon re-entering C-mode, the previously-interrupted programming cycle would continue where it had left off.

Figure 11:
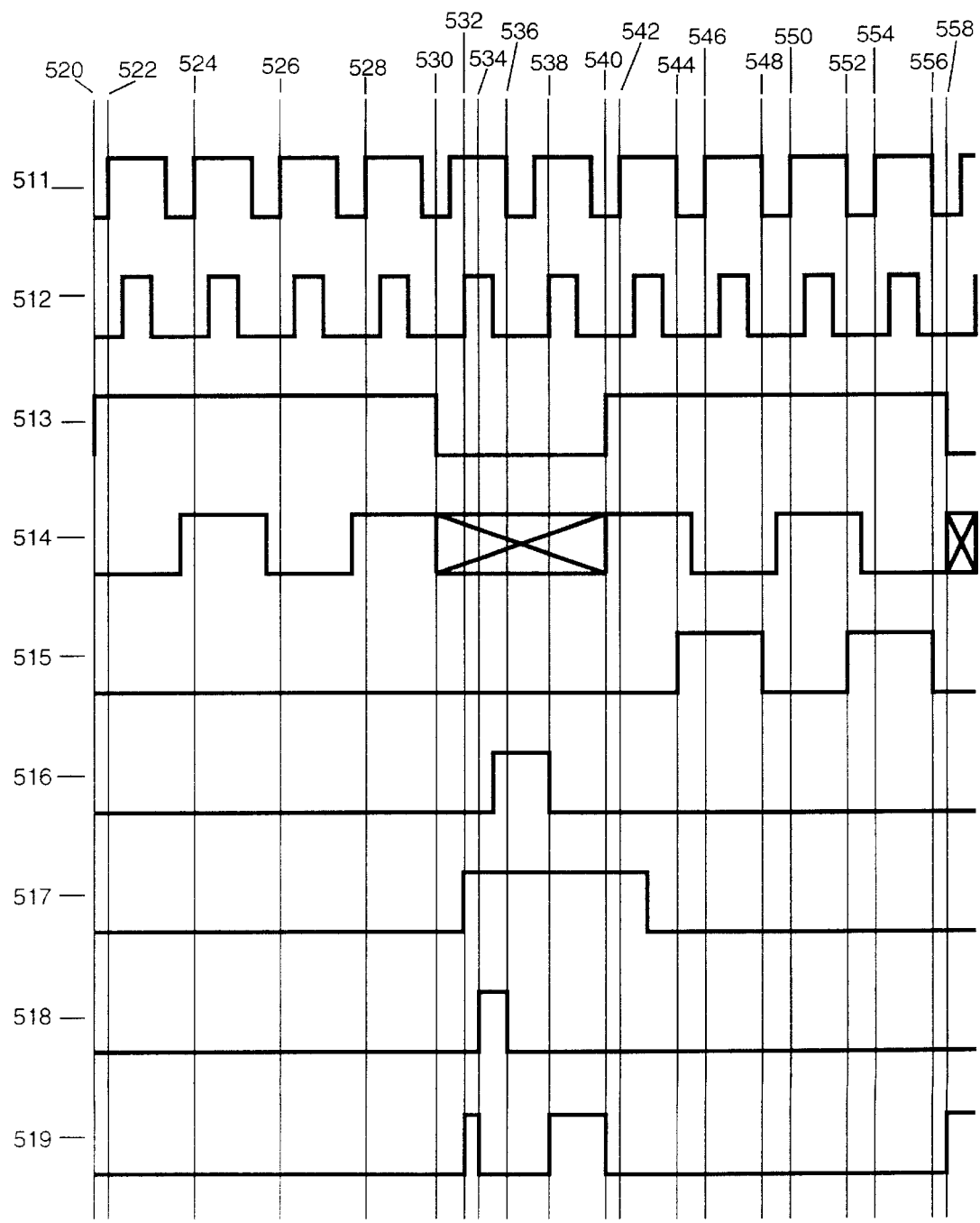
FIG. 11 shows timing diagrams for C-mode operation of a cell.

FIG. 11 illustrates these points via a typical programming sequence. The timing diagram shows nine signals. Clock 1 input 511 and clock 2 input 512 are the standard system clock, and follow a regular pattern throughout. CW input 513 is used to control the mode of the cell, while DW input 514 is used to configure the cell. DW output 515 shows the cell's prior truth table during C-mode operation. DN input 516, DE input 517, DS input 518 and CN output 519 are used to test the cell after it is configured.

At time 520, CW input 513 is raised, and the cell enters C-mode. At time 522, clock 1 input 511 is raised. Since CW input 513 is asserted, DW input 514 is sampled on this rising edge. The cell reads a 0, which is thus loaded into the first truth table position (location 0 as shown in FIG. 10). Clock 2 input 512 is raised, then lowered, then clock 1 input 511 is lowered. This completes the programming of the first bit of the truth table.

At time 524, as clock 1 input 511 again is raised, DW input 514 is again sampled. This time, a value of 1 is read, which will be written into the truth table's second bit position (location 1 on FIG. 10).

At time 526, DW input 514 is sampled, and its value (0) is written into truth table location 2. At time 528, DW input 514 has a value of 1, which is written into truth table location 3.

At time 530, the cell's CW input 513 is lowered, and the cell returns to D-mode. The truth table contains all 0 values, except for locations 1 and 3 in FIG. 10. This truth table thus corresponds to the equation:

$$CNout=(DEin).and.(not\ DNin).and.(not\ DSin)$$

Since the cell is in D-mode, it immediately begins interpreting its truth table, setting its outputs accordingly. Since DE input 517 is 0, CN output 519 is also 0.

At time 532, DE input 517 is raised to 1. As DN input 516 and DS input 518 are both 0, CN output 519 is now set to 1 by the cell.

At time 534 however, DS input 518 is raised, so now the equation for CNout evaluates to 0, and thus CN output 519 drops to 0. At time 536, DS input 518 returns to 0, but DN input 516 has meanwhile been raised, so CN output 519 continues to be 0. At time 538, DN input 516 returns to 0, and CN output 5119 returns to 1.

At time 540, CW input 513 is asserted, and the cell returns to C-mode. Even though the cell's truth table indicates that CN output 519 should be 1, a C-mode cell drives all of its C outputs to 0. Thus, CN output 519 drops to 0. Additionally, since the cell is being programmed from the West, DW output 515 reflects the current value of the cell's truth table, at the position about to be programmed (position 0 in FIG. 10). Currently, this is a 0, so DW output 515 is set by the cell to 0.

Again, at time 542, clock 1 input 511 is raised, and the cell samples DW input 514. This time, it samples a 1, which is written into location 0 in the truth table. Note that DW output 515 continues to reflect the prior value of 0, until time 544, when clock 1 input 511 drops to 0. At this point, the cell samples the next location (location 1) in its truth table, and sends that bit (a 1 in this case) to its DW output 515. Thus DW output 515 is now a 1.

At time 546, the cell samples its DW input 514, which is a 0. It thus writes a 0 into location 1. At time 548, DW output 515 drops, revealing that a 0 was stored in truth table location 2. At time 550, the cell samples DW input 514, detects a 1, and writes that into location 2. At time 552, DW output 515 is raised, revealing that a 1 was stored in truth table location 3. At time 554, DW input 514 is sampled, and the 0 on that line is written into location 3 of the truth table. Finally, at time 556, DW output 515 is lowered, revealing that a 0 was stored in location 4. Note that the timing is arranged so that a bit is read from location "n" before it needs to be asserted to write into location "n." This allows a cell's truth table to be read and rewritten during a single clock cycle, thereby allowing non-destructive read operations on a cell.

At time 558, CW input 513 is lowered, and again the cell returns to D-mode. Again, it immediately begins interpreting its truth table, which now contains all 0s except for location 1 and 3 in FIG. 10. This truth table thus corresponds to the equation:

$$CNout=(not\ DEin).and.(not\ DNin).and.(not\ DSin)$$

Since DE input 517, DN input 516 and DS input 518 are all 0, CN output 519 is thus set to 1.

This is one example of a typical programming sequence. Of course, to configure all 128 bits of a truth table, 128 complete cycles of clock 1 input 511 would be required.

FIG. 4 shows an optional modification to the logic of FIG. 2, by adding a flip flop 108 between line 102 and line 103. 102 feeds Clear-Bar input 170 of flip flop 108, as well as D input 172 of flip flop 108. Clock input 62 feeds Load-Bar input 176 of flip flop 108, and flip flop 108's output 174 is sent to line 103. The result is that if line 102 is raised from 0 to 1, line 103 remains at 0 until the next time clock input 62 goes to 0. When clock input 62 drops, line 103 will then raise to 1 to match line 102, and will remain at a value of 1 as long as line 102 remains at 1. This optional enhancement synchronizes changes in the cell's mode with changes in the incoming clocks 62 and 64. If a C input is raised while clock input 62 is asserted, the C input is effectively ignored until clock input 62 returns to 0.

FIG. 5 shows another optional modification, where a small delay 231 has been added to the lines feeding four of the rates 230, and another delay 232 has been added to the lines feeding the other four gates 230. The purpose of these delays is to rig the timing of changes to outputs 40 and outputs 30 (derived from lines 236), depending on the mode of the cell. Delays 231 introduce a delay in negative transitions of their inputs, while delays 232 introduce a delay in positive transitions. The effect is that when a cell enters C-mode, line 106 drops, so lines 236 will be cleared before C outputs 40. When a cell leaves C-mode, line 106 is raised, so lines 236 will be conditionally asserted (depending on the contents of memory) after C outputs 40 are conditionally asserted.

Research has shows that this timing modification is desirable in certain programming sequences. Specifically, if a cell enters C mode, it will set its own C outputs to 0, and will update its D outputs according to its internal memory. Once a C output drops, neighboring cells will be returned to D-mode, where they will immediately interpret their D inputs (which are the given cell's D outputs). Therefore, on entering C-mode, a cell should set its D outputs properly before setting its C outputs. Conversely, on leaving C-mode, a cell should set its C outputs before its D outputs. Such transition-direction-dependent delay circuits are easily achieved.

FIG. 12A and FIG. 12B show one possible implementation. In FIG. 12A, input 570 is sent to OR gate 576 by two routes, one direct, and the other through delay 574. Of course, output 572 will eventually match input 570. Moreover, if input 570 is changing from 0 to 1, then output 572 will change to 1 as soon as OR gate 576 can respond to its input. However, if input 570 us changing from 1 to 0, the output of delay 574 will remain at 1 for some time after the input has changed, and hence output 572's value of 1 will persist for some time after input 570 has changed to 0. Hence, FIG. 12A is a delay circuit which introduces more delay on a negative transition of its input.

Similarly, in FIG. 12B, a negative transition in input 580 is passed to output 582 as soon as AND gate 586 can respond, while a positive transition will have a delayed action on output 582, since delay 584 will continue to output 0 to AND gate 586 for some time after input 580 has changed to 1.

FIG. 6 shows a 3×3 grid of cells. In practice, a useful grid would be much larger, but the interconnection scheme is independent of size. Cell 450 is an internal cell, meaning all of its inputs are connected to neighboring cells' outputs, and vice versa. Cells such as 460 and 461 are edge cells, meaning some of their C and D inputs and outputs are available to circuits outside the grid itself. For example, in cell 461, line 32 is the cell's D output to the north, while line 12 is the cell's D input from the north. Line 42 is the cell's C output to the north, and line 22 is the cell's C input from the north. Thus, an external circuit which has access to lines 12 and 22 can program cell 461, while by accessing lines 32 and 22 it can interrogate cell 461. Line 42 has less meaning to outside circuitry, in that it is strictly a mode change request, which is meaningless to outside circuitry, unless the outside circuitry is itself another grid.

In addition to each cell's inputs and outputs being connected to neighboring cells' outputs and inputs, all the cells share a small number of common signals. System clock 462 is connected to clock input 62 on each cell, and system clock 464 is connected to clock input 64 on each cell. Additionally, system reset line 470 is connected to each cells' reset line 50. In this way, the entire system can be reset by asserting the single system reset line 470, and all cells can be simultaneously clocked via system clock lines 462 and 464.

The regular structure of the grid in FIG. 6 is key to the scalability of the system. Two such grids can be connected side by side to produce a 3×6 grid. Edge cells are connected in the obvious way (inputs to outputs and vice versa), and the three system signals (462, 464 and 470) are sent to both 3×3 grids. The result is a larger but otherwise identical grid.

Once a grid of cells has been built, complex circuits can be implemented according to standard rules of digital circuit design. Individual cells or small groups of cells are configured to perform as various small scale building blocks, such as gates, multiplexers, wires, and so on. These building blocks can then be assembled to implement higher-level functions. FIG. 13 shows how two cells can be configured to act as a data flip-flop. Cell 500 is programmed to realize the equations:

DS=((NOT DW) AND DS) OR (DW AND DN)

DE=((NOT DW) AND DS) OR (DW AND DN)

And cell 502 is programmed to realize:

DN=DN

DW input 504 acts as the gate, DN input 506 is the data input, and DE output 508 is the Q output (latched value). To operate the gate, a value is supplied to data input 506. If gate input 504 is 1, the data value will appear on output 508. This value is also supplied to cell 502, which feeds it back to cell 500. When gate input 504 is lowered to 0, the current value of input 506 (which is supplied via the feedback path from cell 502) is latched, and will continue to appear on output 508 regardless of input 506's value. When gate input 504 is again raised, input 506 again appears on output 508.

Figure 14:
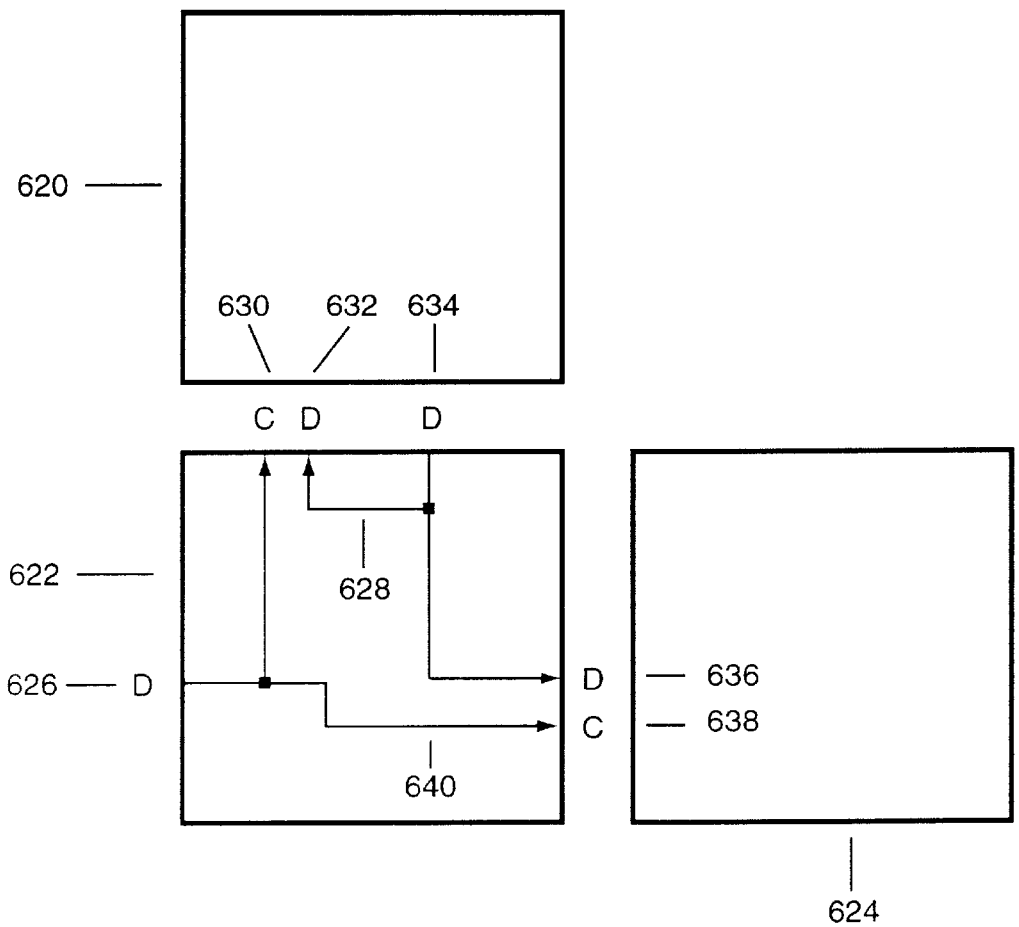
FIG. 14 shows a cell replicator which copies one cell's truth table to another cell.

This is only one simple example of how cells might be configured to perform useful work. Additionally, cells can be configured to use their C outputs to reconfigure other cells. FIG. 14 shows a circuit for copying part or all of one cell's truth table to another cell. Source cell 620 is assumed to have some interesting truth table. Control cell 622 is configured to transfer or copy cell 620's truth table to target cell 624's truth table. This operation is initiated by setting control line 626 to 1. As soon as this is done, C input 630 is asserted, which places cell 620 into C-mode. C input 638 is also asserted, which places cell 624 into C-mode.

Since cell 620 is in C-mode, it will begin sending (according to the system-wide clock) bits of its truth table to its D output 634. These bits are sent by cell 622 to cell 624's D input 636. Since cell 624 is in C-mode, these incoming bits are stored in its own truth table. The effect is that bits from cell 620's truth table are replicated in cell 624's truth table. This is thus a truth table transfer. If it is allowed to continue for 128 clock cycles, the entire truth table will be transferred from cell 620 to cell 624. At that point, if D input 626 is returned to 0, then cell 624 returns to D-mode. It then behaves exactly as cell 620 behaved prior to the transfer operation.

In the above description, cell 620's D input 632 has not been mentioned. If it is supplied with all 0s, then cell 620's truth table will contain all 0s after the transfer. However, if cell 622 is configured to include feedback line 628, then truth table bits from cell 620's truth table are sent out on D output 634, but are also sent back to D input 632. In this way, the act of reading truth table bits from cell 620 no longer clears those bits. Cell 620's truth table is preserved as it is copied to cell 624. This is a truth table copy operation. Thus the circuit in FIG. 14 can be used to perform a non-destructive read and copy of one cell's truth table to another cell.

Note that unlike the prior art (U.S. Pat. No. 5,885,537), this copy operation can run for fewer than 128 clock cycles. If it is stopped (i.e., D input 626 is returned to 0) after, say, 16 cycles, then the first 16 bits (as ordered in FIG. 10) of cell 620's truth table will have been copied to the first 16 bits of cell 624's truth table. Thus the CN output column of cell 620's truth table will have been copied. If D input 626 is subsequently returned to 1, the copy operation begins again, starting with bit 0 of the truth tables. This allows partial-copy operation of truth tables, something which was impossible in the prior art. Similarly, if the copy operation continues for more than 128 cycles, it can be stopped at any time, and the resulting truth tables in cells 620 and 624 will be perfectly correct. In the prior art, the copy operation needed to be stopped at an exact multiple of 128 cycles, otherwise cell 620's truth table and cell 624's truth table would end up shifted, most likely making them unusable.

This arrangement can also be used to generate repeating bit patterns, or to generate a single pulse after a fixed number of clock cycles, simply by loading the appropriate truth table into cell 620. For example, if cell 620's truth table corresponds to the equations:

CE=N.and.S.and.W.and.E

DE=N.and.S.and.W.and.E

Then the truth table will contain exactly two 1s, in locations 63 and 127. The bit pattern sent to cell 624's D input 636 will thus be 0 for 63 clock cycles, followed by a 1, 63 0s, and another 1. This pattern will repeat as long as D input 626 is set to 1. Note that for this application, line 640 would probably be removed, so that D input 636 would be read as data by cell 624, rather than being used to configure cell 624.

If cell 620's truth table were configured with the single equation:

CN=(not N).and.S.and.W.and.E it would contain a single 1, in location 7. If D input 626 is then raised from 0 to 1, D input 636 will be set to 1 after exactly 7 clock cycles. D input 626 can then be reset to 0, which resets the timing sequence. If D input 626 is again raised at any subsequent time, the above sequence is repeated. In the prior art, the sequence would be temporarily suspended when D input 626 was set to 0, and would continue where it had been suspended when D input 626 was returned to 1. Therefore, under the prior art, even though pulses could be generated at any desired intervals, there was a fundamental cycle length of 128 for all such circuits. Under the present invention, cycles of shorter lengths can be achieved.

Description and Operation—Second Embodiment

The above description specifies one particular embodiment of the present invention. Other embodiments are possible and desirable. For example, counter 300 in FIG. 2 is the second largest subsystem within the cell (memory 200 is the largest). However, counter 300 is only used for the C-mode operation of a cell. Research has shown that, in general, two cells entering C-mode will do so at times separated by a multiple of 128 clock cycles. That is, if you imagine a super-clock which ticks every 128 cycles of the regular system clock, cells tend to enter and leave C-mode only on ticks of the super-clock. This presents the possibility that the counter can be removed from each cell, and placed external to the entire grid of cells.

Figure 15:
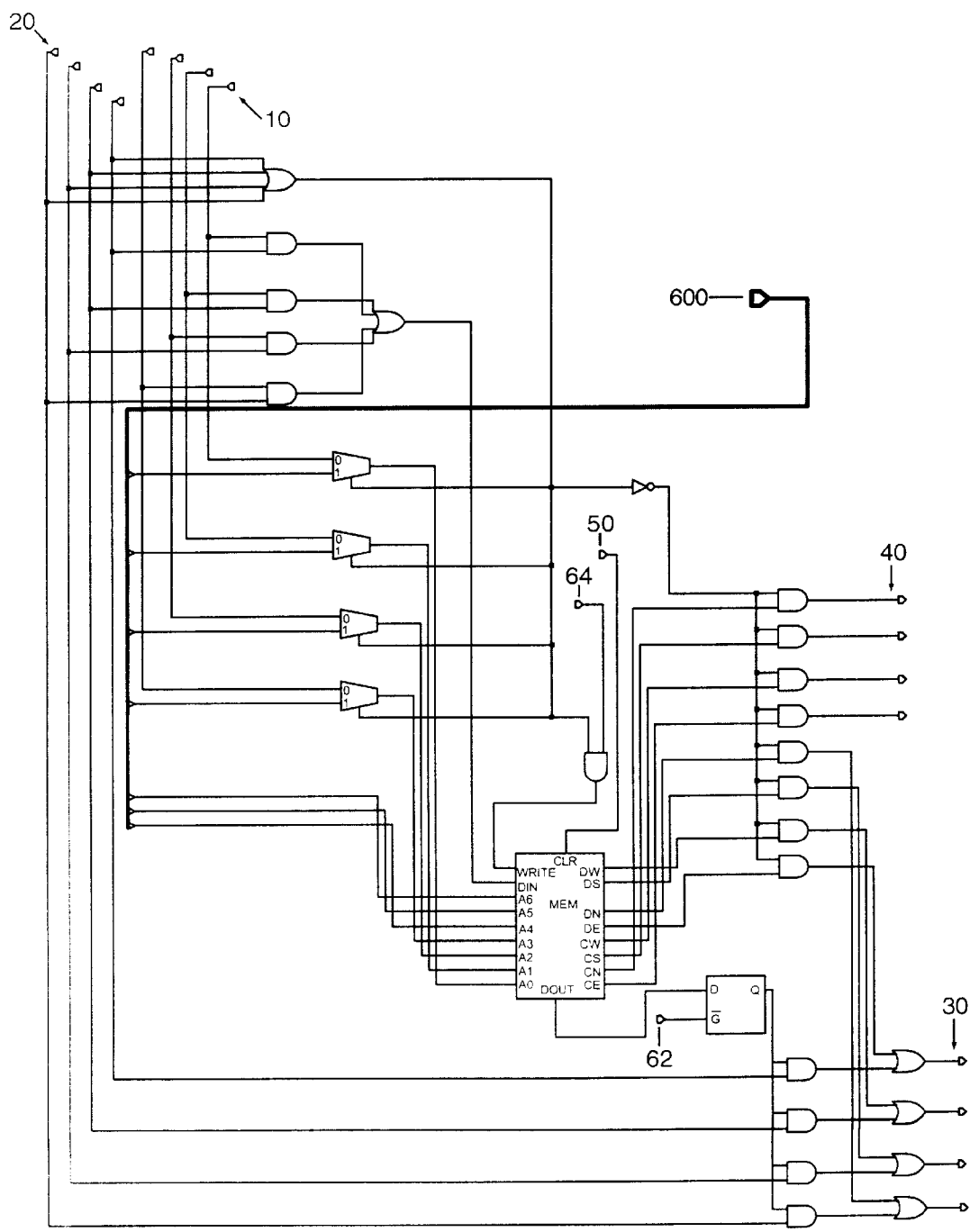
FIG. 15 shows a variation on the circuit of FIG. 2 which utilizes an external counter.

FIG. 15 shows how a single cell may be implemented to allow this. As before, the cell has four D inputs 10, four C inputs 20, four D outputs 30, and four C outputs 40. It also has a reset input 50, and two clock inputs 62 and 64. However, it also has a 7-bit input bus 600 which is supplied by an external 7-bit counter. The cell operates exactly as in the first embodiment, with the exception that when a cell enters C-mode, the location it begins reading from and writing to in its truth table is not reset to 0. Rather, the location is supplied by an external counter driving bus 600. This circuit has the advantage of being smaller and easier to implement, since it does not itself contain a counting circuit. Of course, requiring all cells to operate based on a common external counter may introduce programming complications. However, in practice, C-mode cells are usually synchronized to each other anyway.

Figure 16:
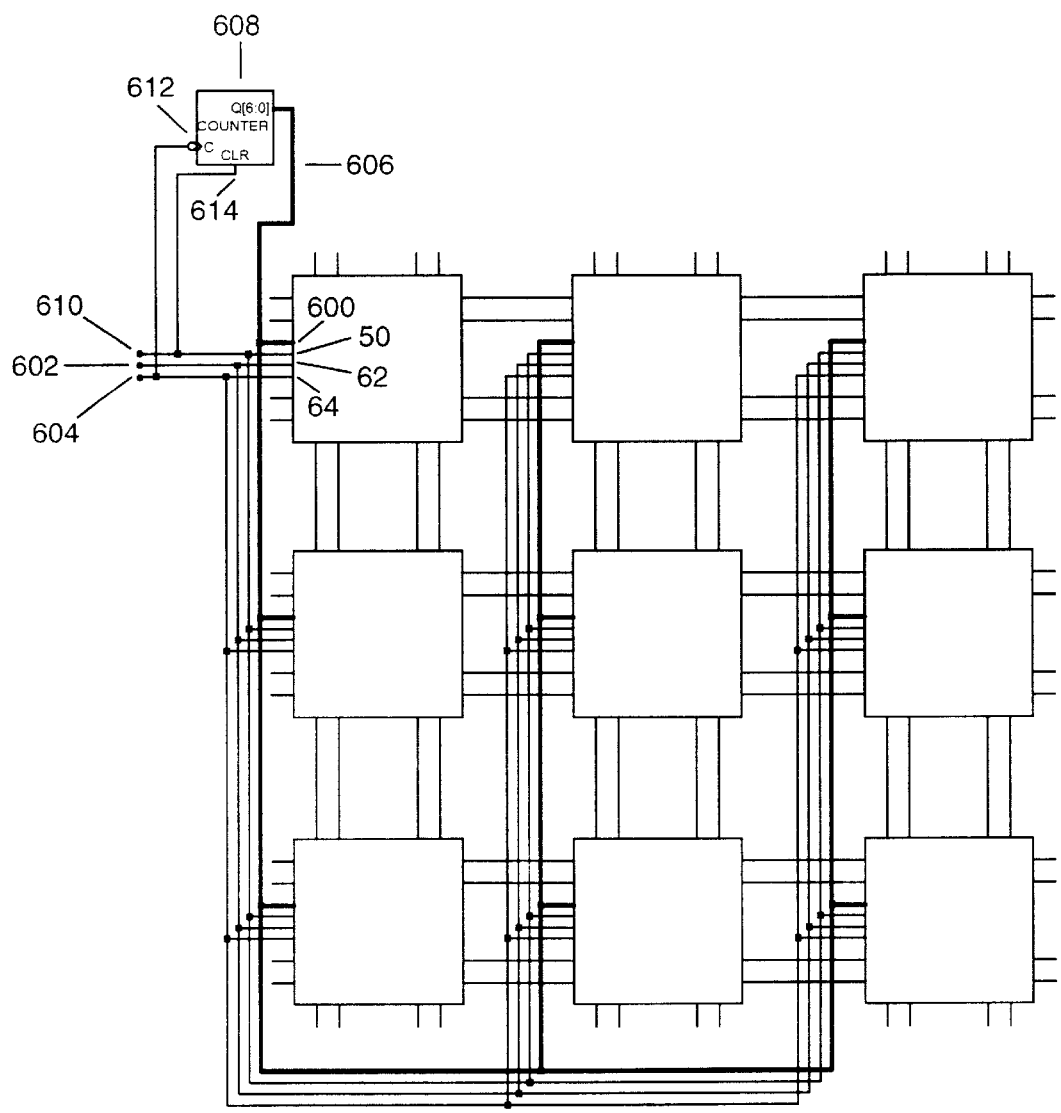
FIG. 16 shows a collection of cells from FIG. 15 configured to operate as a 3×3 grid with an external clock.

FIG. 16 shows a 3×3 collection of cells such as the one shown in FIG. 15. Again, in practice, a useful grid would be larger than 3×3, but the behavior of such grids is effectively independent of their dimensions. System reset input 610 is distributed to the reset input 50 of each cell, system clock 1 input 602 is distributed to clock 1 input 62 of each cell, and system clock 2 input 604 is distributed to clock 2 input 64 of each cell. Additionally, the inputs of each cell are connected to the outputs of neighboring cells, and vice versa. Inputs and outputs of edge cells remain unconnected, available for use by external circuitry.

Additionally, FIG. 16 shows seven-bit counter 608, which is external to the 3×3 grid of cells. Counter 608's clear input 614 is connected to system reset line 610, so that it may be preset to an initial state when the system is first reset. Counter 608's clock input 612 is negative-edge triggered, and is connected to system clock 2 input 604.

Counter 608 produces a seven-bit output, which is sent to bus 606. This bus is also distributed to bus input 600 of each cell.

The behavior of this grid is basically the same as the grid in FIG. 6, except that counter 608 is now supplying the addresses for reading and writing single bits within each cell's 128×1 memory. Functionally, the only difference is that now such reading and writing is synchronized across all C-mode cells. If a cell enters C-mode at an arbitrary time, it may not begin reading and writing its truth table at location 0, but rather at the location currently specified by counter 608's bus output 606. In practice though, mode changes of cells are generally synchronized to each other anyway, so this functional difference is largely theoretical.

Summary, Ramifications, and Scope

The present invention achieves a fine-grained programmable cell whose behavior is specified via software. Additionally, when a group of cells are interconnected, the software defining any given cell can be read and written by neighboring cells, leading to a self-configurable matrix of cells. This self-configurability allows extremely large matrixes to be configured in parallel, since configuration tasks can be handled locally and autonomously, independent of any external controller.

Moreover, unlike the prior art, the present invention implements this basic cell without the use of a shift register. This allows higher-density memory structures to be used to implement each cell. This represents a significant benefit, especially for cells with many sides, since truth table size grows as $O(n*2^n)$, n the number of sides. Moreover, in the current invention, bits which are loaded into a C-mode cell immediately occupy their correct location in the target cell's truth table, regardless of the length of the programming cycle. This has tremendous advantages in certain applications where it is difficult to predict or control the timing of a cell's mode changes. This is particularly useful in evolvable hardware work, which promises to be a primary application of self-configurable circuits.

While the above descriptions contain many specificities, these should not be construed as limitations on the scope of the invention, but rather as examplifications of two preferred embodiments thereof. Many other variations are possible. For example, cells with more than (or fewer than) 4 sides are easily achieved. Different connection topologies among sets of cells are possible. Two-dimensional, three-dimensional, or higher-dimensional topologies are easily achieved. For different topologies, the underlying cell structure remains unchanged. Only the interconnection among cells is affected.

Many other variations are possible as well. The precise mapping from inputs to outputs via the truth table can be implemented in many ways, such as changing the ordering of input and output columns, using inverted logic, etc. The rules for determining the mode of a cell, or calculating an incoming bit value can be changed in many ways.

Furthermore, the specific circuits used to implement these cells are irrelevant, as long as the cells are functionally equivalent to what has been specified. For example, while traditional circuit diagrams have been used to illustrate sample embodiments, it is possible to implement the present invention in a purely mechanical fashion, using mechanical equivalents of gates, flip flops, and so on. If molecular-level switching is someday possible, the present invention could also be implemented using molecular switches. The choice of fabrication technology is irrelevant, as long as the functionality of the cells is preserved.

Accordingly, the scope of the invention should be determined not by the embodiments illustrated, but by the appended claims and their legal equivalents.

What is claimed is:

1. A programmable logic device comprising:
   (a) a first plurality of input channels,
   (b) a second plurality of input channels which correspond one to one with said first plurality of input channels,
   (c) a plurality of output channels, each of which correspond to either one of said first plurality of input channels or one of said second plurality of input channels,
   (d) a means of computing the value of a binary state variable from said first plurality of input channels,
   (e) an internal random access read/random access write storage memory organized as R rows of C columns each,
   (f) a means of conditionally specifying one of said memory's said R rows based on said second plurality of input channels, and reading said memory's corresponding memory outputs from said C columns, depending on value of said binary state variable,
   (g) a means of conditionally setting values of said plurality of output channels based on said memory's corresponding outputs, depending on value of said binary state variable,
   (h) a means of specifying a single bit location within said memory by specifying one of said memory's R rows and further specifying a single bit location within said memory's corresponding memory outputs,
   (i) a means of repeatedly specifying different said single bit locations in said memory,
   (j) a means of combining said first plurality of input channels and said second plurality of input channels to specify a single input bit value,
   (k) a means of conditionally writing said single input bit value into said single bit location in memory depending on value of said binary state variable, and
   (l) a means of reading a single output bit value from said single bit location and conditionally setting values of said plurality of output channels by combining said first plurality of input channels and said single output bit value depending on value of said binary state variable, whereby said programmable logic device can map inputs to output via said storage memory, or can present the contents of said storage memory to certain of its outputs and can load the contents of said random access memory from certain of its inputs.

2. The programmable logic device of claim 1, further including:
   (a) a bit pattern generator,
   (b) a means of repeatedly specifying different said single bit locations by using said bit pattern generator,
   (c) a means of conditionally advancing said bit pattern generator to its next bit pattern, based on the value of said binary state variable and one or more externally supplied clock signals, and
   (d) a means of resetting said bit pattern generator to some predetermined initial state following certain changes in value of said binary state variable,
whereby said device addresses different locations within said storage memory based on said externally supplied clock signals.

3. The programmable logic device of claim 2, where said bit pattern generator is a binary counter.

4. The programmable logic device of claim 1, where said binary state variable is computed by logically ORing said first plurality of input channels.

5. The programmable logic device of claim I, where said single input bit value is computed by logically ORing each of said first plurality of input channels with each of said second plurality of input channels, and then logically ORing the resulting values, whereby said single input bit value may be set high by setting any of said first plurality of input channels high, and also setting the corresponding channel from said second plurality of input channels high.

6. The programmable logic device of claim 1, where said storage memory is organized as a $(2^n) \times (2m)$ random access memory, n being the number of said first plurality of input channels, m being the number of said plurality of output channels.

7. The programmable logic device of claim 1, where:
   (a) said storage memory is organized as a $(2^n) \times (2n)$ memory, n being the number of inputs in said second plurality of inputs,
   (b) said memory's address is conditionally supplied by said second plurality of input channels when said binary state variable is low,
   (c) said plurality of output channels are conditionally set to the 2n output bit values of said storage memory when said binary state variable is low,
   (d) the output channels corresponding to said first plurality of input channels are conditionally set to 0 value when said binary state variable is high,
   (e) each of said plurality of output channels corresponding to each of said second plurality of input channels is conditionally set to said single output bit, under control of said externally supplied clock signals, if the input channel from said first plurality of input channels which corresponds to the input channel from said second plurality of input channels is high and said binary state variable is also high,
   (f) each output channel corresponding to each input channel of said second plurality of input channels is conditionally set to 0 if the input channel from said first plurality of input channels which corresponds to said input channel of said second plurality of input channels is low and said binary state variable is high, and (g) said single input bit value is conditionally stored at the position corresponding to said single output bit under control of said external clock signals if said binary state variable is high, whereby two such said devices may be connected to each other, with each output of one device driving a corresponding input of the other device, allowing the first device to reconfigure the second device, during which time said second device will not attempt to reconfigure said first device.

8. The programmable logic device of claim 1, further including:
  (a) a bit pattern generator which generates a repeating sequence of output bit patterns,
  (b) a means of advancing said bit pattern generator through said sequence of output bit patterns by means of external clock signals,
  (c) a means of generating a set of timing events based on said external clock signals and value of said binary state variable,
  (d) a means of using said output bit patterns to specify said single bit location in said memory,
  (a) a means of causing said reading of single output bit value from said single bit location and conditionally setting values of said plurality of output channels to occur in response to first of said timing events,
  (e) a means of causing said writing of said single input bit value into said single bit location in memory to occur in response to second of said timing events, and
  (f) a means of causing said advancing of said bit pattern generator to occur in response to third of said timing events, whereby the current contents of said memory can be read from said device's outputs and subsequently supplied to said device's inputs to be written back into said device's memory, thereby allowing non-destuctive reading of said memory's contents.

9. The programmable logic device of claim 8, further including a means of synchronizing changes in value of said binary state variable with certain of said timing events.

10. The programmable logic device of claim 1, further including a means of conditionally delaying changes in the values of said plurality of output channels, depending on the direction of said changes.

11. The programmable logic device of claim 1, further including:
  (a) a means of conditionally delaying output changes in output channels corresponding to said first plurality of input channels if said output change is from high to low, and
  (b) a means of conditionally delaying output changes in output channels corresponding to said second plurality of input channels if said output change is from low to high.

12. The programmable logic device of claim 1, where said storage memory includes a preset line, whereby each bit in said storage memory may be initialized to a predetermined value by application of a single preset signal.

13. A collection of programmable devices, each connected to a set of identical neighboring programmable devices according to a predetermined notion of neighborhood and a predetermined interconnection scheme, where each said programmable device comprises:

(a) a first plurality of input channels, (b) a second plurality of input channels which correspond one to one with said first plurality of input channels, (c) a plurality of output channels, each of which correspond to either one of said first plurality of input channels or one of said second plurality of input channels, (d) a means of computing the value of a binary state variable from said first plurality of input channels, (e) an internal random access read/random access write storage memory organized as R rows of C columns each, (f) a means of conditionally specifying one of said memory's said R rows based on said second plurality of input channels, and reading said memory's corresponding memory outputs from said C columns, depending on value of said binary state variable, (g) a means of conditionally setting values of said plurality of output channels based on said memory's corresponding outputs, depending on value of said binary state variable, (h) a means of specifying a single bit location within said memory by specifying one of said memory's R rows and further specifying a single bit location within said memory's corresponding memory outputs, (i) a means of repeatedly specifying different said single bit locations in said memory, (j) a means of combining said first plurality of input channels and said second plurality of input channels to specify a single input bit value, (k) a means of conditionally writing said single input bit value into said single bit location in memory depending on value of said binary state variable, and (l) a means of reading a single output bit value from said single bit location and conditionally setting values of said plurality of output channels by combining said first plurality of input channels and said single output bit value depending on value of said binary state variable.

14. The collection of programmable devices of claim 13, where
  (a) the number of said neighboring programmable devices is the same as the number of input channels in said first plurality of input channels,
  (b) the number of channels in said second plurality of input channels is the same as the number of channels in said first plurality of input channels,
  (c) the number of channels in said plurality of output channels is twice the number of channels in said first plurality of input channels, and
  (d) the interconnection among said programmable devices is such that, for any two neighboring devices:
    i) a channel from said first plurality of input channels of one device is connected to a channel from said plurality of output channels of the other device,
    ii) a channel from said second plurality of input channels of one device is connected to a channel from said plurality of output channels of the other device,
    iii) one channel from said plurality of output channels of one device is connected to a channel from said first plurality of input channels of the other device, and
    iv) one channel from said plurality of output channels of one device is connected to a channel from said second plurality of input channels of the other device, whereby each said programmable device has its inputs connected to the outputs of other programmable devices, and its outputs connected to the inputs of other programmable devices.

15. The collection of programmable devices of claim 14, where certain of said programmable devices are connected to fewer neighboring programmable devices than others, whereby the corresponding unconnected input and output channels are available for access by external devices.

16. The collection of programmable devices of claim 13, further including:
   (a) a set of clock signals, and
   (b) a means of propagating said set of clock signals to a plurality of said programmable devices,
whereby multiple devices may be clocked simultaneously by application of a single set of clock pulses.

17. The collection of programmable devices of claim 13, further including:
   (a) a common preset signal, and
   (b) a means of propagating said preset signal to a plurality of said programmable devices,
whereby multiple devices may each be set to its predetermined initial state by application of a single preset signal.

18. The collection of programmable devices of claim 13, each one of said programmable devices further including:
   (a) a bit pattern generator,
   (b) a means of repeatedly specifying different said single bit locations by using said bit pattern generator,
   (c) a means of conditionally advancing said bit pattern generator to its next bit pattern, based on the value of said binary state variable and one or more externally supplied clock signals, and
   (d) a means of resetting said bit pattern generator to some predetermined initial state following certain changes in value of said binary state variable,
whereby each of said programmable devices successively addresses different locations within said storage memory based on said externally supplied clock signals.

19. The collection of programmable devices of claim 16, further including:
   (a) a bit pattern generator located externally to each of said programmable devices,
   (b) a means of distributing outputs of said bit generator to each of said programmable devices, and
   (c) a means of advancing said bit pattern generator to next pattern in its sequence, based on said set of clock signals,
whereby each of said programmable devices addresses locations within said storage memory based on said outputs from said bit pattern generator, without each of said programmable devices requiring its own bit pattern generator.

20. A set of programmable devices, one of which is called a replicator, and one of which is called a source, each of said devices comprising:
   (a) a first plurality of input channels,
   (b) a second plurality of input channels which correspond one to one with said first plurality of input channels,
   (c) a plurality of output channels, each of which correspond to either one of said first plurality of input channels or one of said second plurality of input channels,
   (d) a means of computing the value of a binary state variable from said first plurality of input channels,
   (e) an internal random access read/random access write storage memory organized as R rows of C columns each,
   (f) a means of conditionally specifying one of said memory's said R rows based on said second plurality of input channels, and reading said memory's corresponding memory outputs from said C columns, depending on value of said binary state variable,
   (g) a means of conditionally setting values of said plurality of output channels based on said memory's corresponding outputs, depending on value of said binary state variable,
   (h) a means of specifying a single bit location within said memory by specifying one of said memory's R rows and further specifying a single bit location within said memory's corresponding memory outputs,
   (i) a means of repeatedly specifying different said single bit locations in said memory,
   (j) a means of combining said first plurality of input channels and said second plurality of input channels to specify a single input bit value,
   (k) a means of conditionally writing said single input bit value into said single bit location in memory depending on value of said binary state variable, and
   (l) a means of reading a single output bit value from said single bit location and conditionally setting values of said plurality of output channels by combining said first plurality of input channels and said single output bit value depending on value of said binary state variable,
said set of configurable devices further comprising:
   (m) a predefined interconnection topology among said devices,
   (n) a notion of adjacency among pairs of said devices,
   (o) a means of transferring inputs to outputs among adjacent pairs of said devices,
   (p) a means for said replicator to conditionally assert one of said source's said first plurality of input channels, depending on the value of said replicator's said second plurality of inputs, thereby causing successive bits from said source's storage memory to be read,
   (q) a means for said successive bits to conditionally be passed to one of said replicator's said second plurality of input channels, depending on the value of said replicator's said second plurality of inputs, and
   (r) a means for said successive bits which are passed to said one of said replicator's said second plurality of input channels to conditionally be transferred to one or more of said replicator's said plurality of outputs, depending on value of said replicator's said second plurality of inputs,
whereby the contents of said source's storage memory is presented on one or more of said replicator's said plurality of output channels.

21. The set of programmable devices of claim 20, where said replicator and said source are adjacent according to said notion of adjacency.

22. The set of programmable devices of claim 20, where one of said replicator's outputs to which said successive bits are passed is used to supply bits to one of said source's said second plurality of input channels, whereby the storage memory of said source is read in a non-destructive fashion.

23. The set of programmable devices of claim 20, further including:
   (a) a third programmable device, called the target,
   (b) a means for said replicator to conditionally assert one of said target's said first plurality of input channels, depending on value of said replicator's said second plurality of inputs, thereby causing said target's storage memory to be written, and (c) a means for said replicator to conditionally transfer said successive bits from said source to one of said target's said second plurality of inputs channels, depending on value of said replicator's said second plurality of inputs, whereby the contents of said source's storage memory is copied into said target's storage memory.

24. The set of programmable devices of claim 23, where one of said replicator's outputs to which said successive bits are passed is used to supply bits to one of said source's said second plurality of input channels, whereby the storage memory of said source is read in a non-destructive fashion.

25. The set of programmable devices of claim 23, where sets of adjacent intervening programmable devices are configured to pass inputs to outputs among said source, said replicator and said target, whereby said replicator copies said storage memory of a not necessarily adjacent source device into the storage memory of a not necessarily adjacent target device.

26. The set of programmable devices of claim 20, where said source device's storage memory is preloaded with a fixed bit pattern, such that said replicator conditionally generates a periodic sequence of bits on one or more of its outputs, depending on the values of certain of its said second plurality of inputs.

* * * * *